(12) United States Patent
Liao et al.

(10) Patent No.: US 6,933,592 B2
(45) Date of Patent: Aug. 23, 2005

(54) SUBSTRATE STRUCTURE CAPABLE OF REDUCING PACKAGE SINGULAR STRESS

(75) Inventors: Virgil Liao, Hsinchu (TW); Ben Weng, Hsinchu (TW); Jai Yi Wang, Hsinchu (TW)

(73) Assignee: Global Advanced Packaging Technology H.K. Limited, Kowloon (HK)

( * ) Notice: Subject to any disclaimer, the term of this patent is extended or adjusted under 35 U.S.C. 154(b) by 0 days.

(21) Appl. No.: 10/739,168

(22) Filed: Dec. 19, 2003

(65) Prior Publication Data

US 2005/0133890 A1 Jun. 23, 2005

(51) Int. Cl.[7] .......................................... H01L 23/495

(52) U.S. Cl. ..................... 257/671; 257/678; 257/778

(58) Field of Search .............................. 257/671, 678, 257/704, 710, 778, 787

(56) References Cited

U.S. PATENT DOCUMENTS 5,953,589 A * 9/1999 Shim et al. ................. 438/106

* cited by examiner

*Primary Examiner*—Howard Weiss
*Assistant Examiner*—(Vikki) Hoa B. Trinh
(74) *Attorney, Agent, or Firm*—Rosenberg, Klein & Lee

(57) ABSTRACT

A substrate structure capable of reducing the package singular stress comprises a substrate having a plurality of substrate units. A molding gate is provided at a corner of each substrate unit. A plurality of slots are provided at the periphery of each substrate unit. A connection portion is provided between every two adjacent slots. These connection portions include a first connection portion and two second connection portions. The first connection portion is located at each molding gate. The second connection portions are located between two adjacent corners of each substrate unit, and opposite to each other. Through appropriate position arrangement of the connection portions, the molding gate stress at the corner of each package unit can be reduced. Moreover, the situation of breakage of trace in the substrate and peeling of molding compound from the substrate can be avoided.

5 Claims, 5 Drawing Sheets

SUBSTRATE STRUCTURE CAPABLE OF REDUCING PACKAGE SINGULAR STRESS

FIELD OF THE INVENTION

The present invention relates to a substrate structure and, more particularly, to a substrate structure capable of reducing the package singular stress with arranging connection portions between a substrate and each substrate unit thereof.

BACKGROUND OF THE INVENTION

Along with continual progress of the semiconductor fabrication technology, the corresponding electronic packaging technology is also enhanced gradually. The higher sophistication of integrated circuits (ICs), the smaller tolerance of the packaging process. Therefore, how to develop a packaging technique having a better reliability and a higher assembly yield is a problem much emphasized in this industry.

As shown in FIG. 1, a package product not yet processed by the package singular step comprises a substrate 10 having a plurality of substrate units 11. Each substrate unit has a package unit 12 and a plurality of slots 14 are formed at the periphery of each substrate unit 11. The slots 14 can be used as borders of the substrate units 11 when performing the package singular process. Before performing the package singular process, a plurality of connection portions 16 are arranged at corners of each substrate unit 11 to connect each substrate unit 11 and the substrate 10 together. However, when performing the package singular process, the punch moves along the slots 14 for singulation and the singular pressure extends from the connection portions 16 toward two sides. Since the corners of the package unit 12 are nearest to the connection portions 16, the stress per unit area is the highest at the corners of each package unit 12. This stress will easily cause breakage of trace in the package substrate 10 or peeling of molding compound 18 from the package substrate 10, as shown in FIG. 2. Therefore, the yield of the package product will be decreased.

Accordingly, the present invention aims to propose a package substrate structure capable of reducing punch stress for effectively solving the problems in the prior art.

SUMMARY OF THE INVENTION

The primary object of the present invention is to provide a substrate structure capable of reducing the package singular stress. Through appropriate position arrangement of connection portions of each package unit and the package substrate, the stress at corners of each package unit can be reduced during the package singular process, hence avoiding the situation of breakage of trace in the substrate and peeling of molding compound and the substrate.

Another object of the present invention is to provide a substrate structure capable of reducing the package singular stress for enhancing the yield of the assembly process.

According to the present invention, a substrate structure capable of reducing the package singular stress comprises a substrate having a plurality of substrate units. A package unit is provided on each substrate unit. A molding gate is provided at a corner of each substrate unit. A plurality of slots are formed at the periphery of each substrate unit. A plurality of connection portions are located between adjacent slots to connect each substrate unit and the package substrate together. These connection portions include a first connection portion located at each molding gate and two second connection portions located between two adjacent corners of each substrate unit. Because the second connection portions are located between two adjacent corners but not at a corner of each substrate unit, the package singular stress at the corner of each substrate unit can be reduced when performing the package singular process. Therefore, the stress at the corner of each package unit arranged on a substrate unit can be reduced. Moreover, the situation of breakage of trace in the substrate and peeling of molding compound from the substrate can be avoided.

The various objects and advantages of the present invention will be more readily understood from the following detailed description when read in conjunction with the appended drawings, in which.

DETAILED DESCRIPTION OF PREFERRED EMBODIMENT

The present invention provides a substrate structure capable of reducing the package singular stress. Through appropriate position arrangement of connection portions between a substrate and substrate unit thereof, the package singular stress at the corner of each substrate unit can be reduced. Moreover, the situation of breakage of trace in the substrate and peeling of molding compound from the substrate can be avoided.

Figure 1:
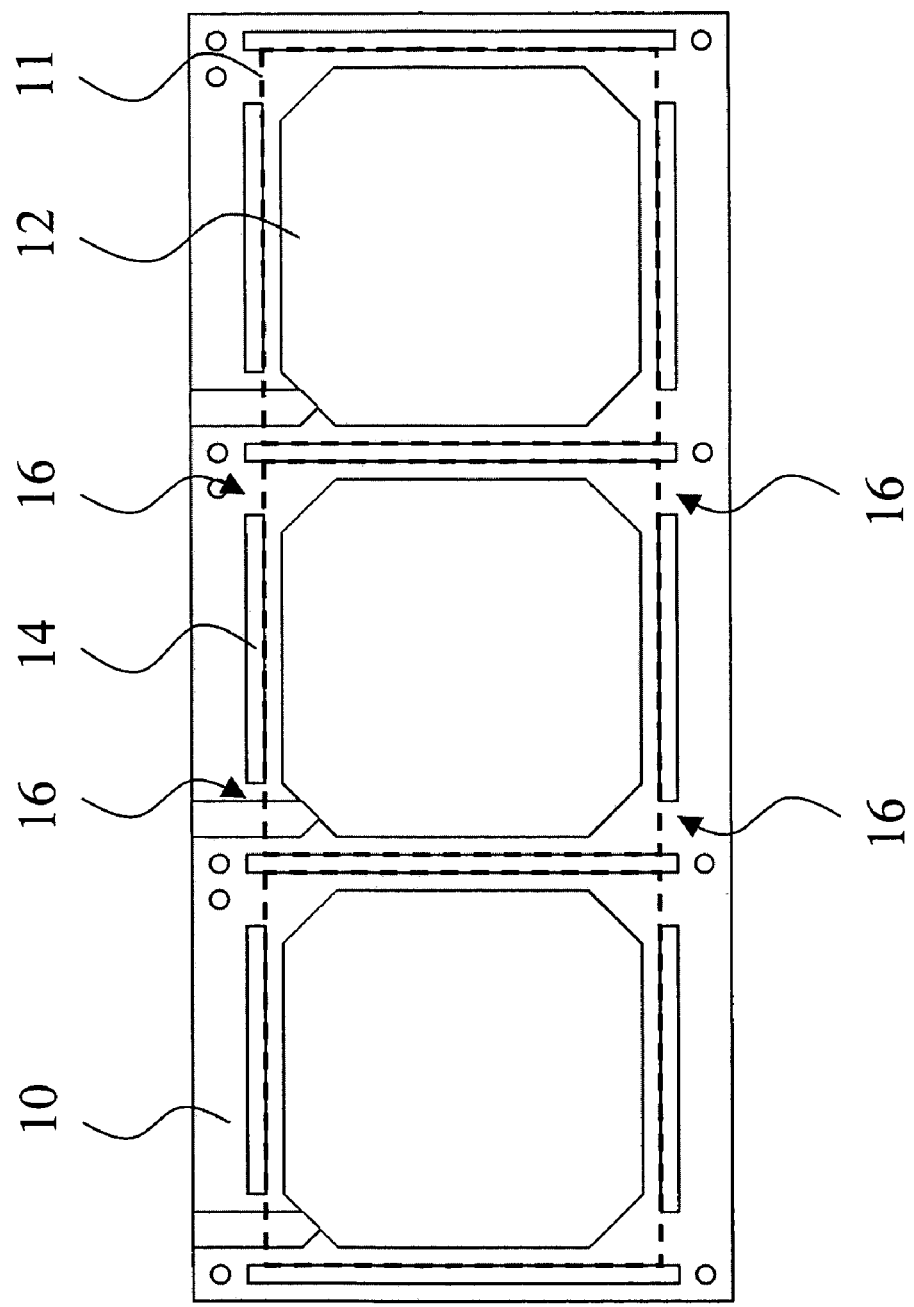
FIG. 1 is a diagram of a conventional package product before package singular process.
Figure 2:
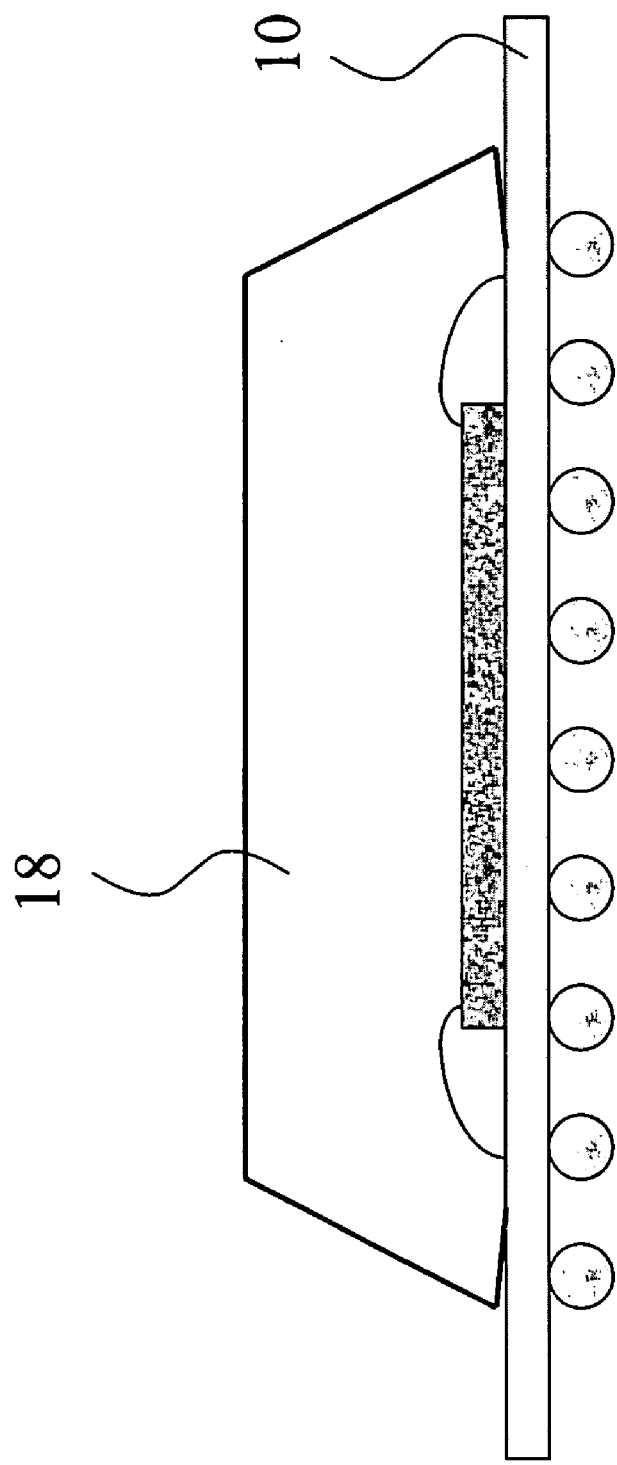
FIG. 2 is a diagram showing the peeling between a molding compound and a package substrate of a conventional package product after package singular process.
Figure 3:
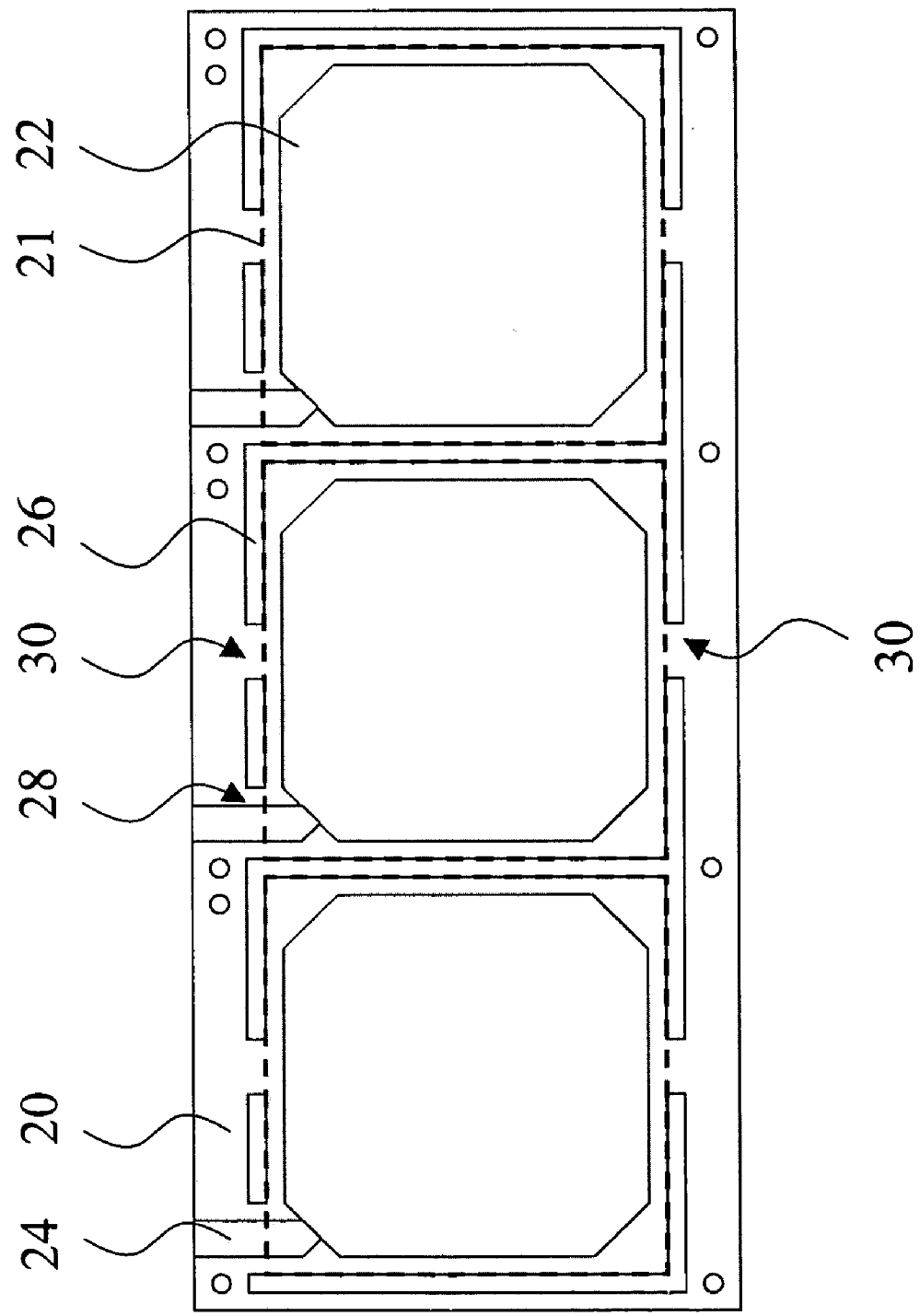
FIG. 3 is a diagram illustrating a package product of the present invention before package singular process.
Figure 4:
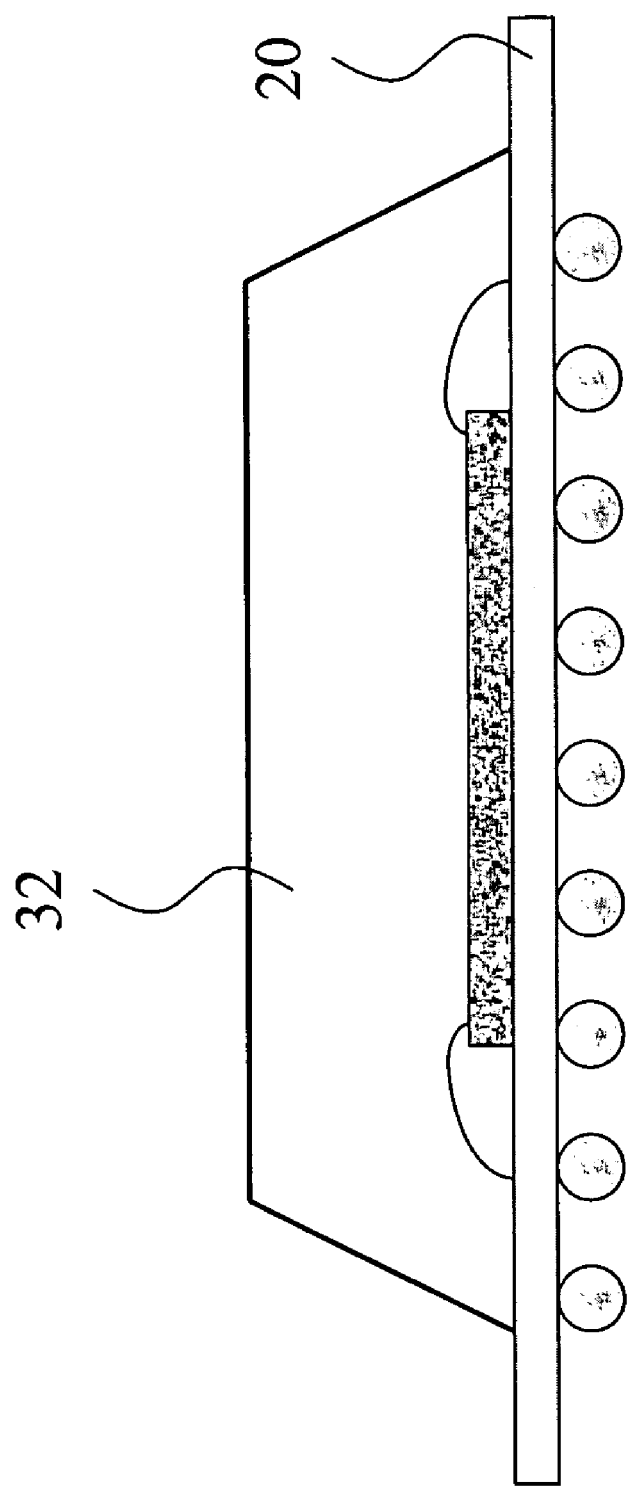
FIG. 4 is a diagram illustrating a package product of the present invention after package singular process.
Figure 5:
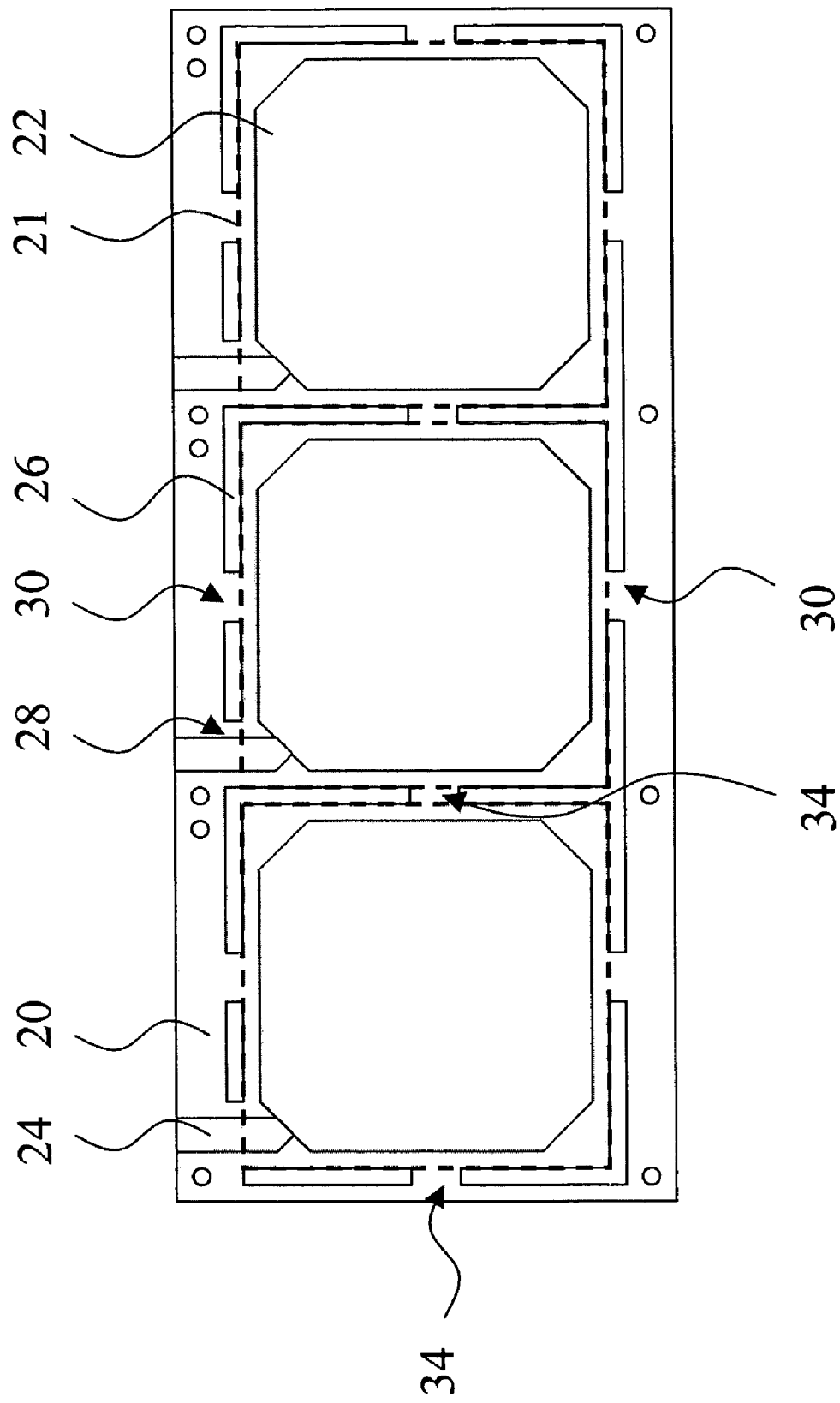
FIG. 5 is a diagram showing another embodiment of the present invention.

As shown in FIG. 3, a substrate 20 has a plurality of substrate units 21, each having a package unit 22 thereon. The package units 22 can be formed by means of the ball grid array package technique. A molding gate 24 is formed at a corner of each substrate unit 21. A plurality of slots 26 are formed at the periphery of each substrate unit 21 as singular borders between the package units 22. A plurality of connection portions are provided between adjacent slots 26 to connect each substrate unit 21 and the package substrate 20 together before the package singular process. These connection portions include a first connection portion 28 and two second connection portions 30. The first connection portion 28 is located at each molding gate 24. The two second connection portions 30 are located between two adjacent corners of each substrate unit 21, and opposite to each other across the package unit 22. Because the second connection portions 30 are not at a corner of each substrate unit 21, the package singular stress along the slots 26 caused by the punch are uniformly born by the side portions of each substrate unit 21. Therefore, the stress at the corner of each package unit arranged on a substrate unit 21 can be reduced. Moreover, the situation of breakage of trace in the package substrate 20 and peeling of molding compound 32 from the package substrate 20 can be avoided, as shown in FIG. 4.

Besides, in consideration of the requirement in practice, other connection portions 34 can be added in addition to the first and second connection portions to enhance the flexibility in practice and the effect.

To sum up, through appropriate position arrangement of the connection portions between the substrate and the substrate unit thereof, the package singular stress at the corner of each package unit can be reduced. Moreover, the situation of breakage of trace in the substrate and peeling of molding compound from the substrate can be avoided, thereby increasing the yield of the assembly process.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A substrate structure capable of reducing the package singular stress, comprising:
    a substrate having a plurality of substrate units thereof;
    a plurality of molding gates each provided at a corner of each said substrate unit;
    a plurality of slots formed at a periphery of each said substrate unit and used for the package singular process; and
    a plurality of connection portions for respectively separating said plurality of slots and connecting each said substrate unit and said substrate, said plurality of connection portions including a first connection portion located adjacent each said molding gate, each of said substrate unit having at least two second connection portions respectively located intermediate two adjacent corners of two opposing sides of said substrate unit to respectively define two slots on each of said opposing sides;
    whereby the stress at the corner of each said substrate unit during the package singular process is reduced by the location of the second connection portions.

2. The package substrate structure capable of reducing the package singular stress as claimed in claim 1, wherein a package unit is built on each said substrate unit.

3. The package substrate structure capable of reducing the package singular stress as claimed in claim 2, wherein said package unit is a ball grid array package unit.

4. The package substrate structure capable of reducing the package singular stress as claimed in claim 1, wherein said two second connection portions are opposite to each other.

5. The package substrate structure capable of reducing the package singular stress as claimed in claim 1, wherein each of said substrate units has four second connection portions respectively located intermediate two adjacent corners of four sides of said substrate unit to respectively define two slots on each of said four sides.

* * * * *